(12) United States Patent
Lee et al.

(10) Patent No.: US 10,816,176 B1
(45) Date of Patent: Oct. 27, 2020

(54) LIGHT SOURCE PACKAGE STRUCTURE

(71) Applicants:LITE-ON OPTO TECHNOLOGY (CHANGZHOU) CO., LTD., Changzhou, Jiangsu Province (CN); LITE-ON TECHNOLOGY CORPORATION, Taipei (TW)

(72) Inventors: Wen Lee, Shiyan (CN); Hsiang-Chih Hung, Pingtung County (TW); Da-Peng Lyu, Shenqiu County (CN); Shu-Hua Yang, Taichung (TW); Yu-Hung Su, Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/868,869

(22) Filed: May 7, 2020

(30) Foreign Application Priority Data

May 7, 2019 (CN) .......................... 2019 1 0378781
Jan. 3, 2020 (CN) .......................... 2020 1 0004957

(51) Int. Cl.
*F21V 23/00* (2015.01)
*F21K 9/00* (2016.01)
*C09J 9/02* (2006.01)
*F21Y 115/30* (2016.01)

(52) U.S. Cl.
CPC ............... *F21V 23/002* (2013.01); *C09J 9/02* (2013.01); *F21K 9/00* (2013.01); *F21Y 2115/30* (2016.08)

(58) Field of Classification Search
CPC .. F21V 23/002; F21K 9/00; C09J 9/02; F21Y 2115/30
See application file for complete search history.

(56) References Cited

U.S. PATENT DOCUMENTS

| | | | |
|---|---|---|---|
| 9,594,207 B2 * | 3/2017 | Kim ..................... | G02B 6/0023 |
| 2016/0380171 A1 * | 12/2016 | Lin ...................... | H01L 33/642 257/98 |
| 2019/0195486 A1 * | 6/2019 | Kim ..................... | F21V 31/005 |
| 2020/0251458 A1 * | 8/2020 | Tsai ..................... | H05K 1/181 |

* cited by examiner

*Primary Examiner* — Evan P Dzierzynski
(74) *Attorney, Agent, or Firm* — Li & Cai Intellectual Property (USA) Office (57) ABSTRACT

A light source package structure is provided. The light source package structure includes a substrate, an upper electrode layer and a lower electrode layer respectively disposed on two sides of the substrate, a light emitting unit mounted on the upper electrode layer, a surrounding wall disposed on the substrate and arranged to surround the light emitting unit, a conductive unit disposed on the surrounding wall and electrically connected to the lower electrode layer, a light permeable element disposed on the surrounding wall, a detection circuit formed on the light permeable element, and at least one conductive adhesive. The conductive adhesive includes a colloid and a plurality of fillers mixed with the colloid. The colloid and the fillers of the conductive adhesive are partially filled within the gap.

16 Claims, 11 Drawing Sheets

LIGHT SOURCE PACKAGE STRUCTURE

CROSS-REFERENCE TO RELATED PATENT APPLICATION

This application claims the benefit of priority to China Patent Application No. 202010004957.9, filed on Jan. 3, 2020, and No. 201910378781.0, filed on May 7, 2019, in People's Republic of China. The entire content of the above identified application is incorporated herein by reference. Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light source package structure, and more particularly to a light source package structure including at least one conductive adhesive that has a plurality of fillers.

BACKGROUND OF THE DISCLOSURE

Conventional light source package structures mostly use a TO-CAN (Transistor Outline-CAN) package structure. However, as there have been no major structural improvements in recent years, the conventional light source package structures have become increasingly difficult to meet various requirements.

SUMMARY OF THE DISCLOSURE

In response to the above-referenced technical inadequacies, the present disclosure provides a light source package structure to effectively improve on the issues associated with conventional light source package structures.

Therefore, the light source package structure of the present disclosure provides a structure that is different from a TO-CAN (Transistor Outline-CAN) package structure to meet different requirements nowadays. Specifically speaking, the fillers of the conductive adhesive are partially filled within the gap between the surrounding wall and the light permeable element. Accordingly, the conductive adhesive does not collapse from the gap, so that a bridge of the electrical connection can be improved through the fillers of the conductive adhesive.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 16, an embodiment of the present disclosure provides a light source package structure 100, and more particularly to a light source package structure 100 for a 3D sensing, such as the light source package structure 100 applying a vertical cavity surface emitting laser (VCSEL) or an infrared light source, but the present disclosure is not limited thereto. For example, the light source package structure 100 can also apply a LED or a laser.

Figure 1:
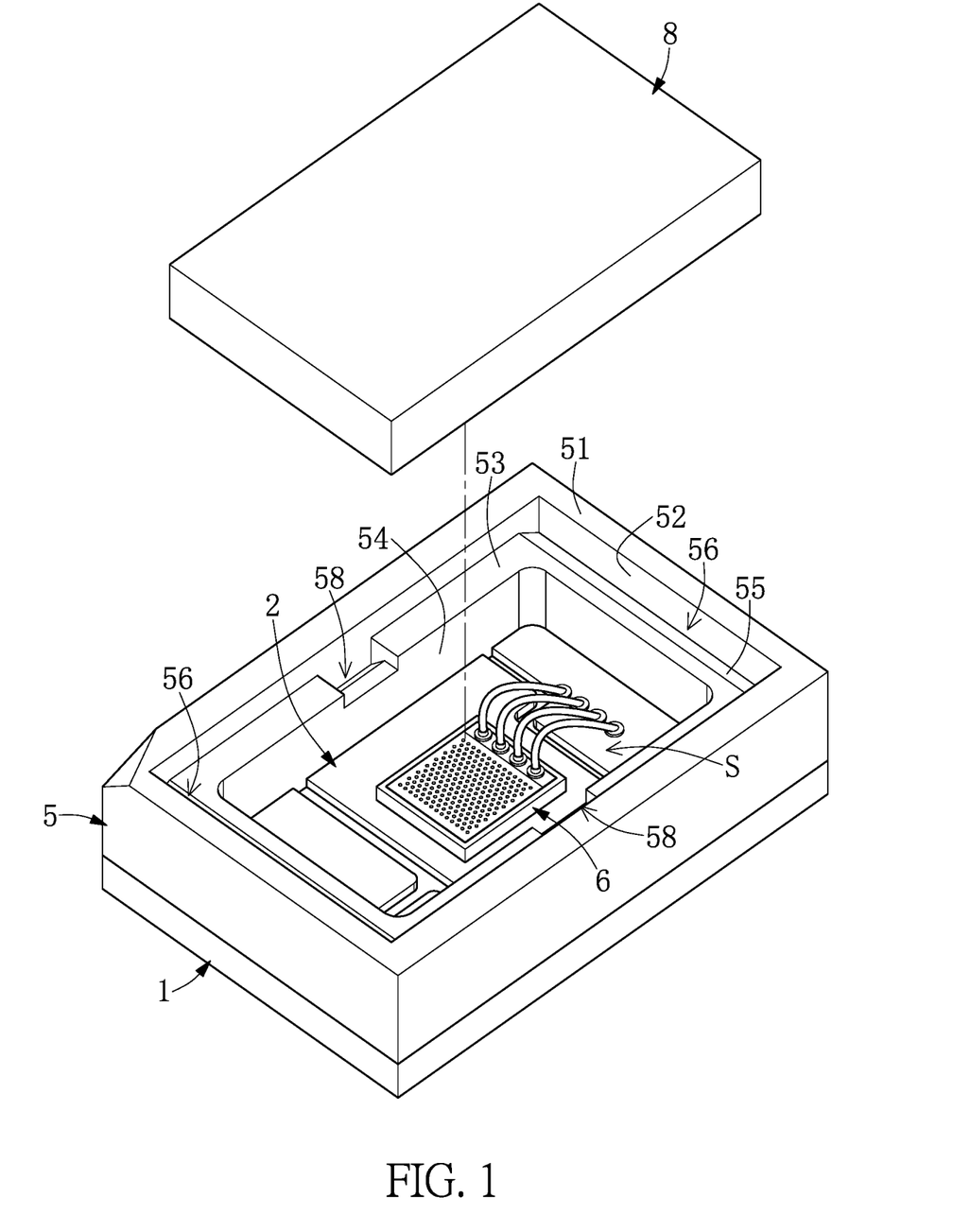
FIGS. 1 to 3 are schematic views of a light source package structure according to an embodiment of the present disclosure.
Figure 2:
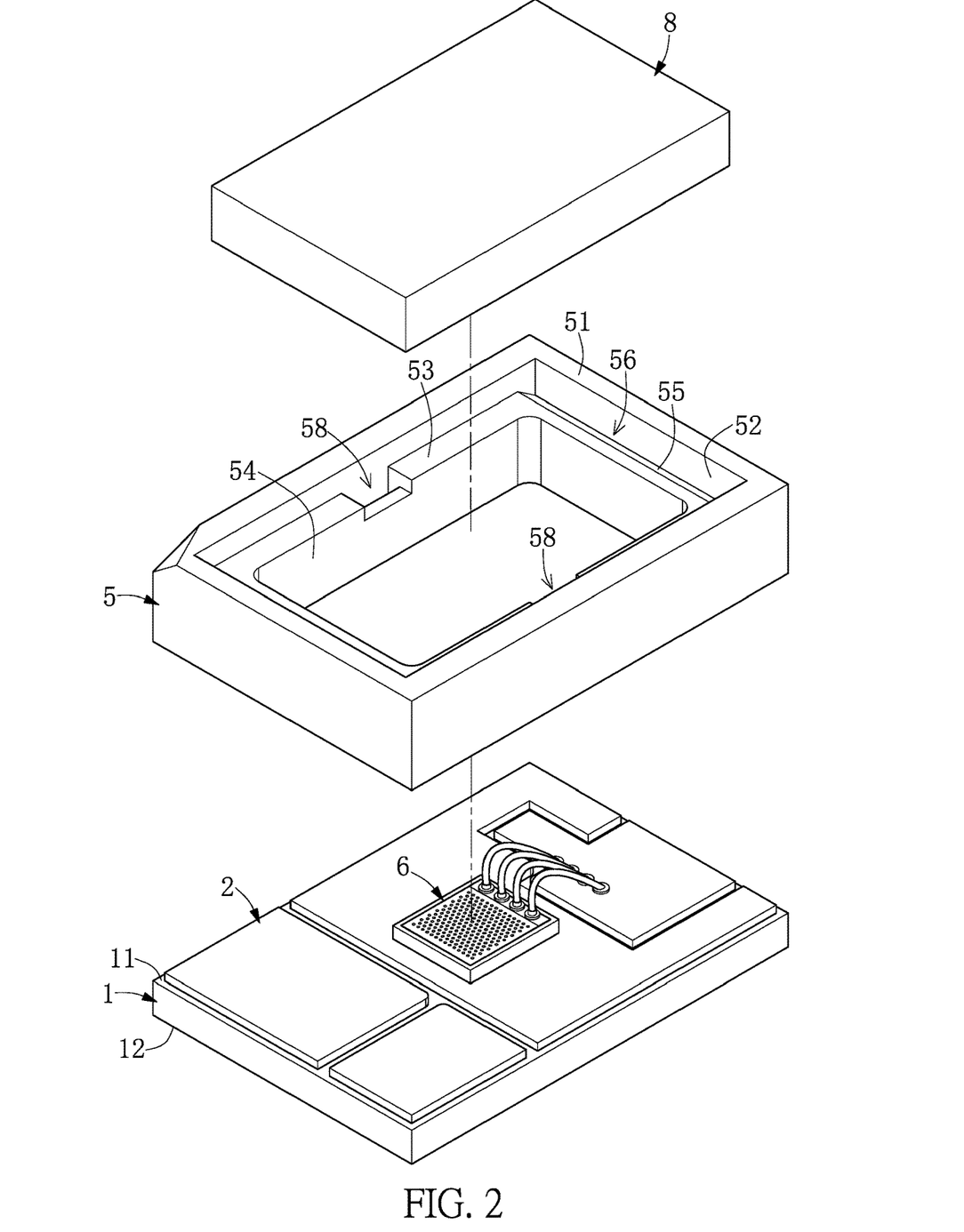
Figure 3:
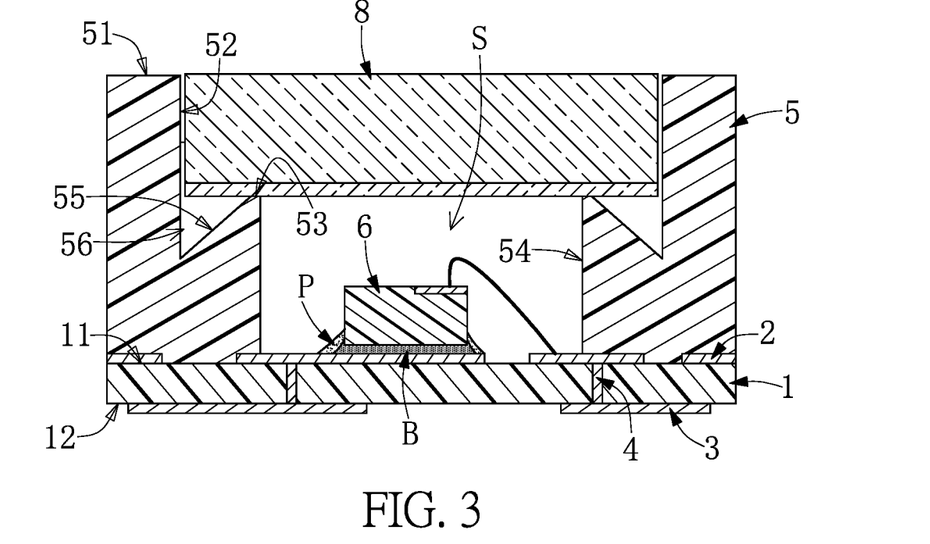

As shown in FIG. 1 to FIG. 3, a light source package structure 100 is provided. That is, the light source package structure 100 can be adjusted according to design requirements, but it is not limited thereto. The light source package structure 100 includes a substrate 1, an upper electrode layer 2 and a lower electrode layer 3 respectively disposed on opposite sides of the substrate 1, a plurality of conducting pillars 4 embedded inside of the substrate 1, a surrounding wall 5 disposed on the substrate 1, a light emitting unit 6 mounted on the upper electrode layer 2, a light permeable element 8 disposed on the surrounding wall 5, and an adhesive 9 that is provided to fix the light permeable element 8 onto the surrounding wall 5.

The substrate 1 is substantially a rectangular shape (such as a rectangle shape or a square shape) in the present embodiment. The substrate 1 of the present embodiment is a ceramic substrate and includes a first surface 11 and a second surface 12 that is opposite to the first surface 11. The material of the substrate 1 is not limited to the ceramic, and the material of the substrate 1 can also be a circuit board or other insulating substrate.

The upper electrode layer 2 is disposed on the first surface 11 of the substrate 1, and the lower electrode layer 3 is disposed on the second surface 12 of the substrate 1. The conducting pillars 4 are embedded inside of the substrate 1. Each of the conducting pillars 4 has two ends that are respectively connected to the upper electrode layer 2 and the lower electrode layer 3, so that the upper electrode layer 2 can be electrically connected to the lower electrode layer 3 through the plurality of conducting pillars 4.

The surrounding wall 5 is made of the liquid crystal polymer and disposed on the first surface 11 of the substrate 1. An outer edge of the surrounding wall 5 is coplanar with an outer edge of the substrate 1, and a peripheral part of the upper electrode layer 2 is sandwiched between the above-mentioned surrounding wall 5 and the substrate 1. The surrounding wall 5 is annular with a step structure, and the surrounding wall 5 of the present embodiment is a one-piece molded structure, but the present disclosure is not limited thereto.

Specifically, the surrounding wall 5 includes an upper tread surface 51, an upper riser surface 52 connected to an inner edge of the upper tread surface 51, a lower tread surface 53, each of the above mentioned element (i.e., 51-54) are sequentially arranged from an outside to an inside of the surrounding wall 5. Furthermore, in the present embodiment, the surrounding wall 5 includes two inclined surfaces 55 that are respectively connected to the upper riser surface 52 and the lower tread surface 53, and the two inclined surfaces 55 are respectively connected to two opposite sides of the lower tread surface 53 (e.g., two short edges of the lower tread surface 53 in FIG. 2).

The upper tread surface 51 is a square annular shape (such as a rectangular annular shape or a square annular shape) and is arranged away from the substrate 1. The upper tread surface 51 in the present embodiment is a top surface of the surrounding wall 5, and the upper tread surface 51 is preferably parallel to the first surface 11 of the substrate 1. The upper riser surface 52 is a square annular shape and is vertically connected to the inner edge of the upper tread surface 51. The lower tread surface 53 is a square annular shape and is disposed at an inner side of the upper riser surface 52. The lower tread surface 53 is preferably parallel to the upper tread surface 51, and a distance between the lower tread surface 53 and the first surface 11 is less than a distance between the upper tread surface 51 and the first surface 11. The lower riser surface 54 is a square annular shape. The lower riser surface 54 is vertically connected to an inner edge of the lower tread surface 53 and is arranged away from the upper tread surface 51. The lower riser surface 54 and the first surface 11 of the substrate 1 jointly define a receiving space S.

Furthermore, one side of each of the two inclined surfaces 55 (e.g., an inner edge of each of the inclined surfaces 55 in FIG. 3) is connected to the lower tread surface 53 to form an angle greater than 90 degrees, and the other side of each of the two inclined surfaces 55 (e.g., an outer edge of each of the inclined surfaces 55 in FIG. 3) and the upper riser surface 52 jointly form an accommodating groove 56 that has an angle less than 90 degrees. That is, positions of the two accommodating grooves 56 of the surrounding wall 5 are opposite to each other, but the present disclosure is not limited thereto. For example, in other embodiments not shown, the surrounding wall 5 can include at least one inclined surface 55 and at least one accommodating groove 56 corresponding in position to the at least one inclined surface 55. That is, the accommodating groove 56 is disposed between the lower tread surface 53 and the upper riser surface 52.

In addition, the surrounding wall 5 has two notches 58 that are recessed from the lower tread surface 53 and the lower riser surface 54 and that are in spatial communication with the receiving space S. The two notches 58 are arranged opposite to each other. The two notches 58 of the surrounding wall 5 are preferably and respectively disposed at a center of two long edges of the lower tread surface 53. That is, the two accommodating grooves 56 of the surrounding wall 5 and the two notches 58 respectively correspond in position to four edges of the lower tread surface 53, but the present disclosure is not limited thereto. For example, in other embodiments of the present disclosure, the surrounding wall 5 can also have at least one notch 58.

As shown in FIG. 1 to FIG. 3, in the present embodiment, the light emitting unit 6 is the vertical cavity surface emitting laser (VCSEL) that provides an infrared light. The light emitting unit 6 is disposed in the receiving space S, and the light emitting unit 6 preferably corresponds in position to a center of the first surface 11.

In the present embodiment, the light permeable element 8 is a transparent glass plate and a light-diffusing layer disposed on the transparent glass plate. The light permeable element 8 is disposed on the lower tread surface 53 of the surrounding wall 5 and is spaced apart from the upper riser surface 52 (that is, the light permeable element 8 does not contact the upper riser surface 52). Accordingly, each of the notches 58 defines an air flow channel that is in spatial communication with the receiving space S and an external space.

Figure 4:
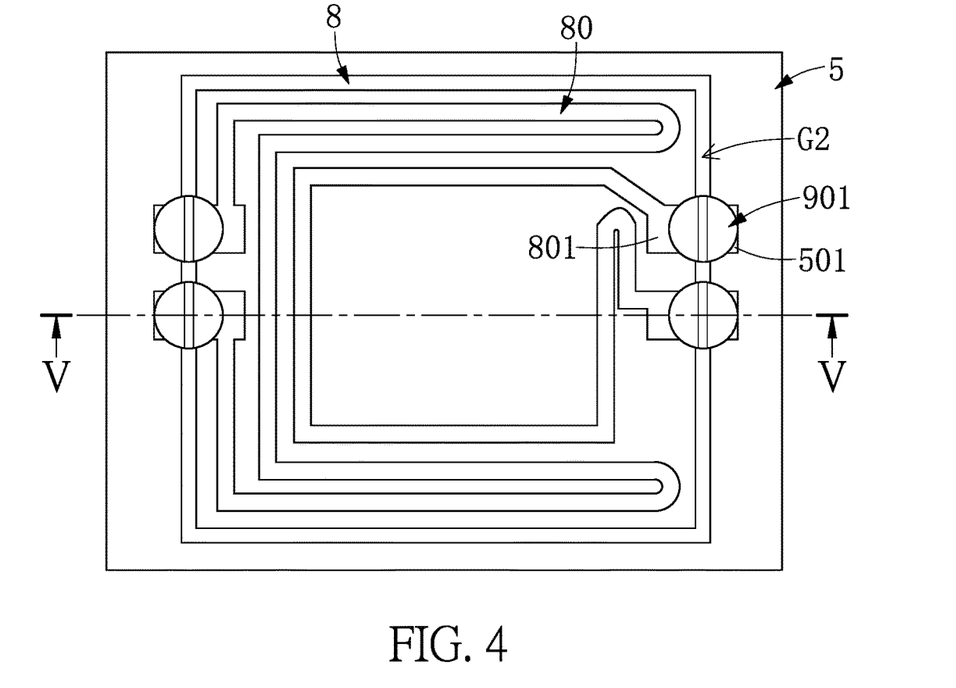
FIGS. 4 to 8 are schematic views of the light source package structure according to the embodiment of the present disclosure.
Figure 5:
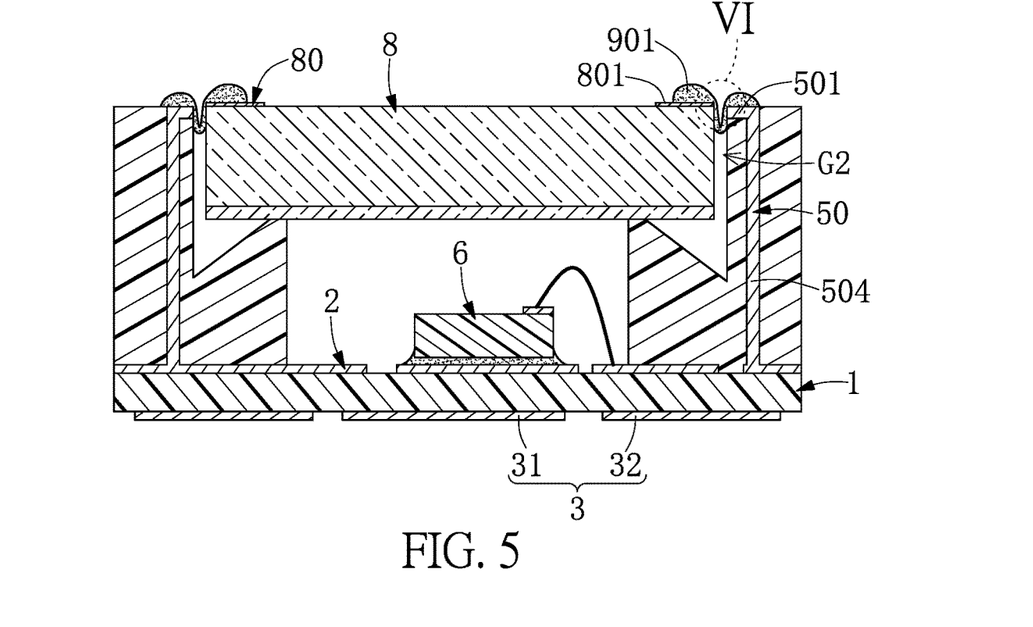
Figure 6:
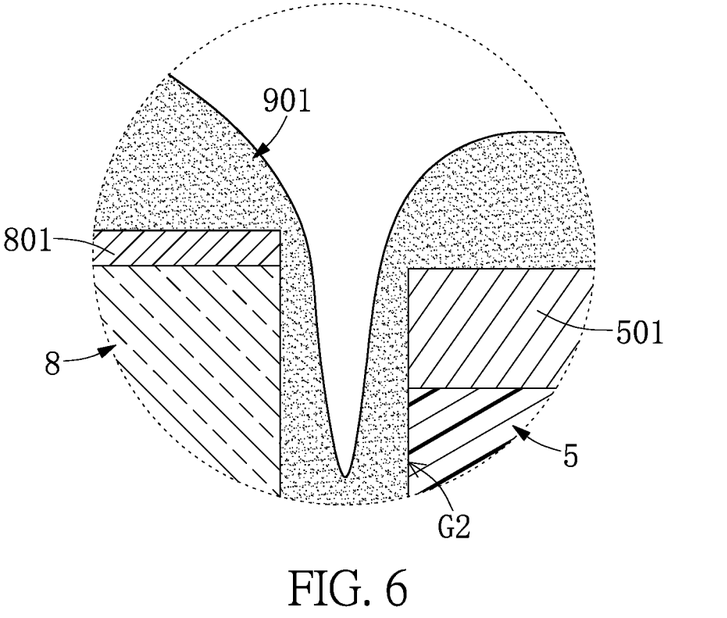
Figure 7:
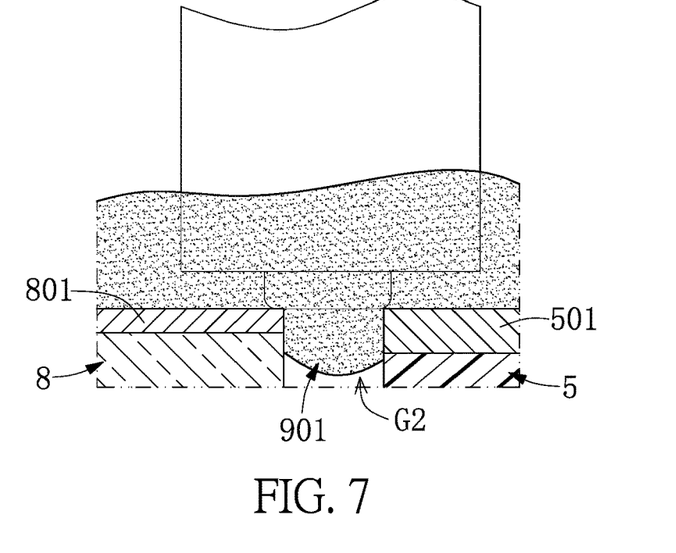
Figure 8:
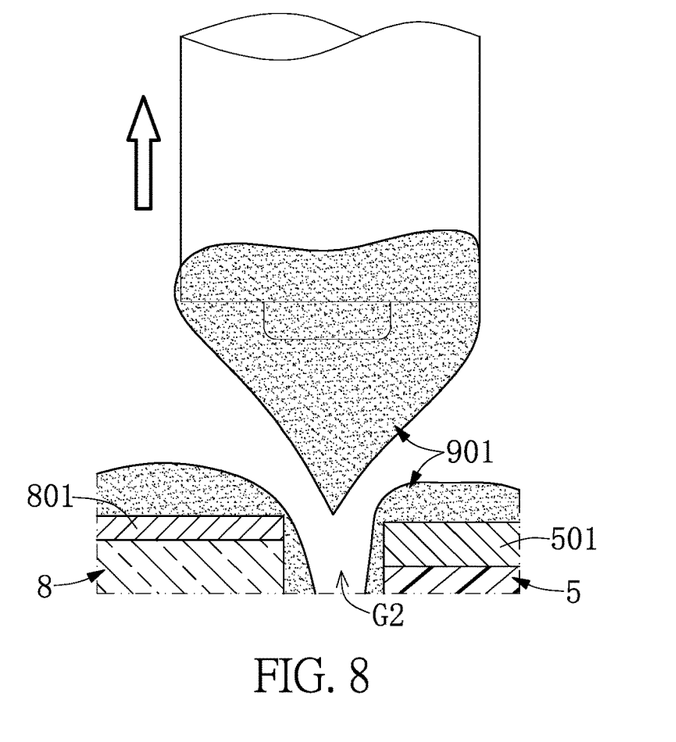

As shown in FIG. 4 to FIG. 6, a light source package structure that is formed by adjusting the light source package structure shown in FIG. 1 to FIG. 3 is provided, and the same part of the light source package structure shown in FIG. 1 to FIG. 3 will not be reiterated herein. A main difference between the light source package structure shown in FIG. 1 to FIG. 3 and the light source package structure shown in FIG. 4 to FIG. 6 is described as follows. The lower electrode layer 3 includes a first lower electrode layer 31 and a second lower electrode layer 32, and the light emitting unit 6 is electrically connected to the first lower electrode layer 31 through the upper electrode layer 2. Furthermore, the light source package structure 100 further includes a conductive unit 50 disposed on the surrounding wall 5 and electrically connected to the second lower electrode layer 32, at least one detection circuit 80 formed on the light permeable element 8, and a least one conductive adhesive 901.

The conductive unit 50 includes at least one upper pad 501 arranged away from the substrate 1. The conductive unit 50 includes at least one transmission lines 504 on the surrounding wall 5 and the substrate 1. In this embodiment, the conductive unit 50 includes a plurality of upper pads 501 and a plurality of transmission lines 504. The transmission lines 504 are configured to respectively and electrically connect the upper pads 501 to the second lower electrode layer 32. The detection circuit 80 is preferably a transparent conductive and includes a plurality of metal contacts 801 respectively arranged adjacent to the upper pads 501. Specifically, each of the metal contacts 801 are substantially coplanar with each of the upper pads 501, such that the metal contacts 801 are respectively and electrically connected to the upper pads 501 through the conductive adhesives 901.

It should be noted that high-power laser packages are more widely used in consumer electronics, so that the eye safety has become an important issue. The detection circuit 80 is a protecting mechanism that protects eyes are not harmed by the vertical cavity surface emitting laser 6, that is, a transparent conductive layer of the detection circuit 80 is formed on a top or a bottom surface of the light permeable element 8. The transparent conductive layer may be an indium tin oxide (ITO) layer, but it is not limited thereto. The detection circuit 80 is formed on the light permeable element and is connected to the substrate 1, when the light permeable element 8 falls off or breaks, an open circuit is formed by the detection circuit 80 and then a protection mechanism is triggered so as to protect the human eye.

Figure 9:
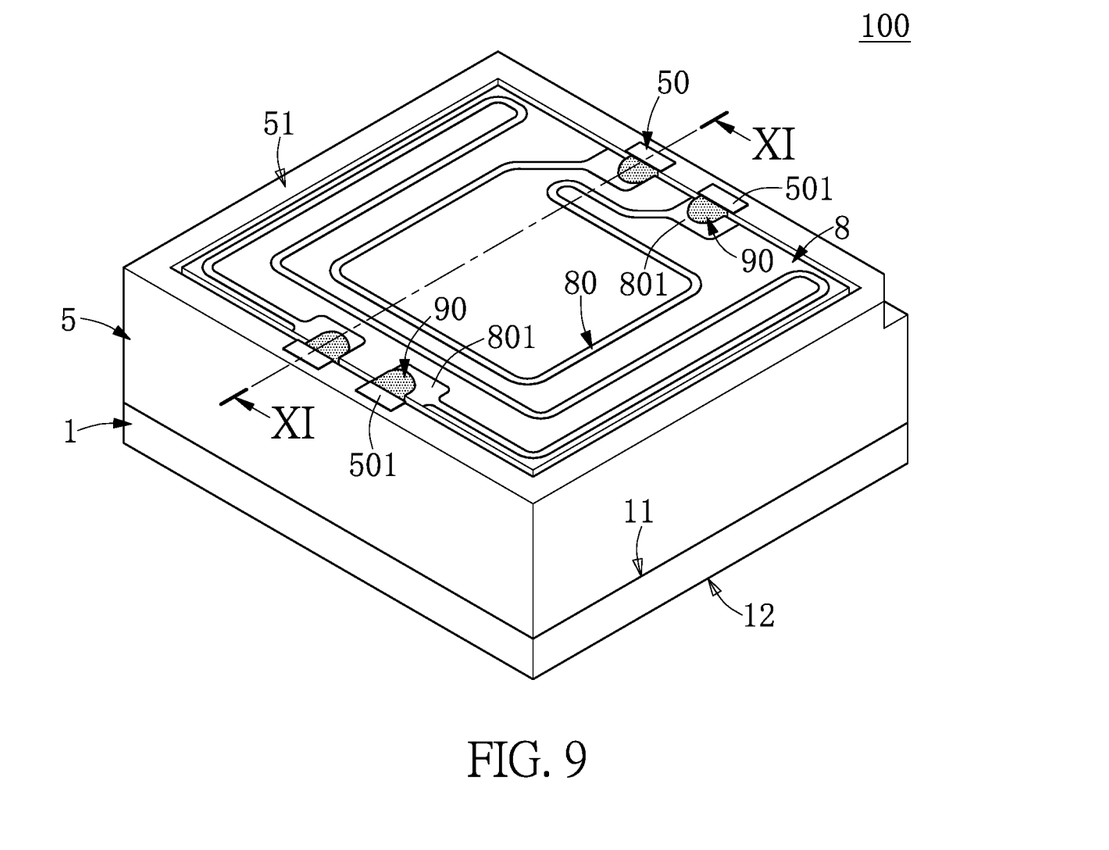
FIG. 9 is a perspective view of the light source package structure of the embodiment of the present disclosure.
Figure 10:
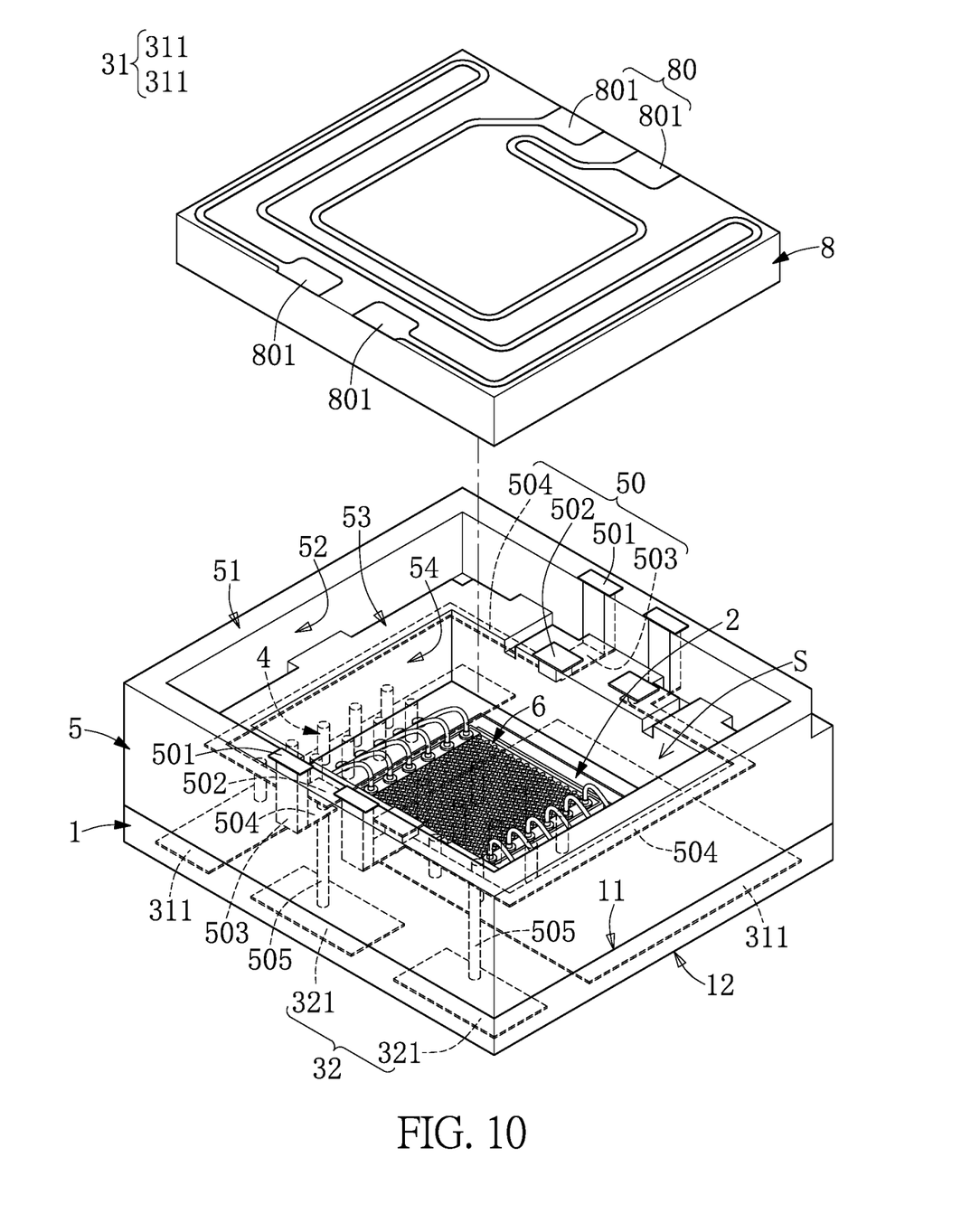
FIG. 10 is an exploded view of the light source package structure shown in FIG. 9.
Figure 11:
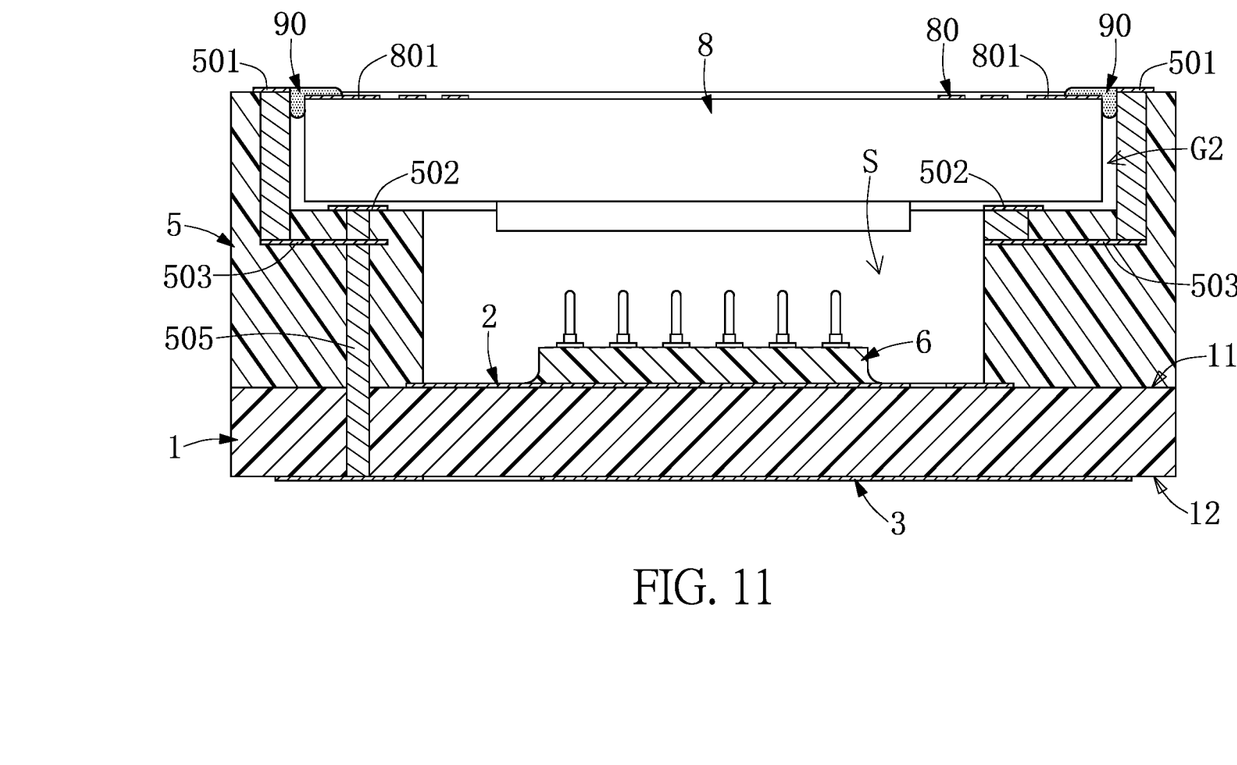
FIG. 11 is a sectional view taken along line XI-XI of FIG. 9.
Figure 12:
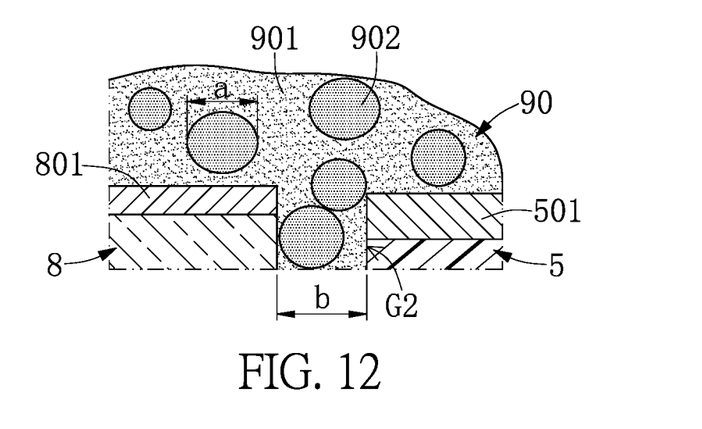
FIGS. 12 to 14 are partially enlarged views of FIG. 11.
Figure 13:
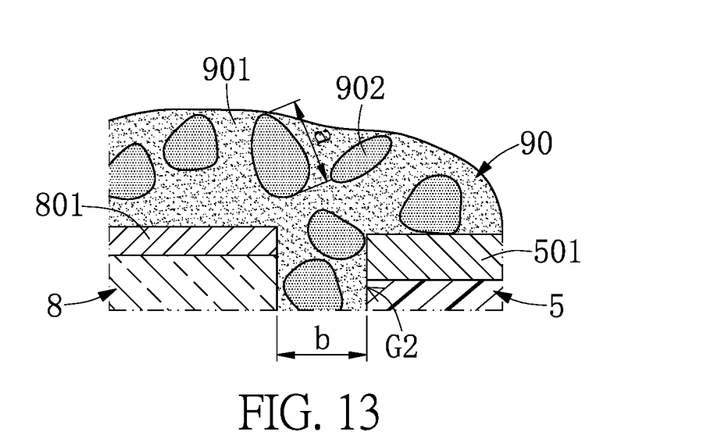
Figure 14:
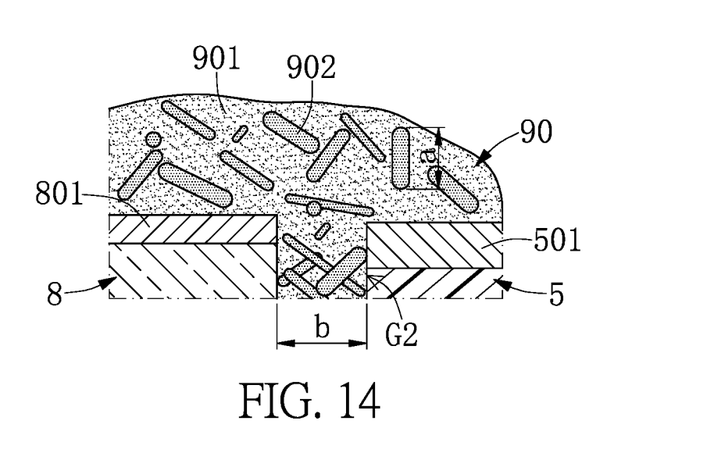
Figure 15:
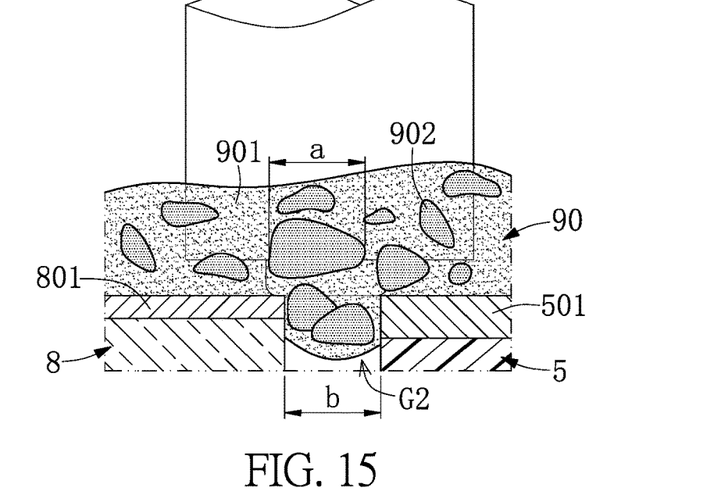
FIG. 15 and FIG. 16 are partially formed views of the light source package structure of the embodiment of the present disclosure.
Figure 16:
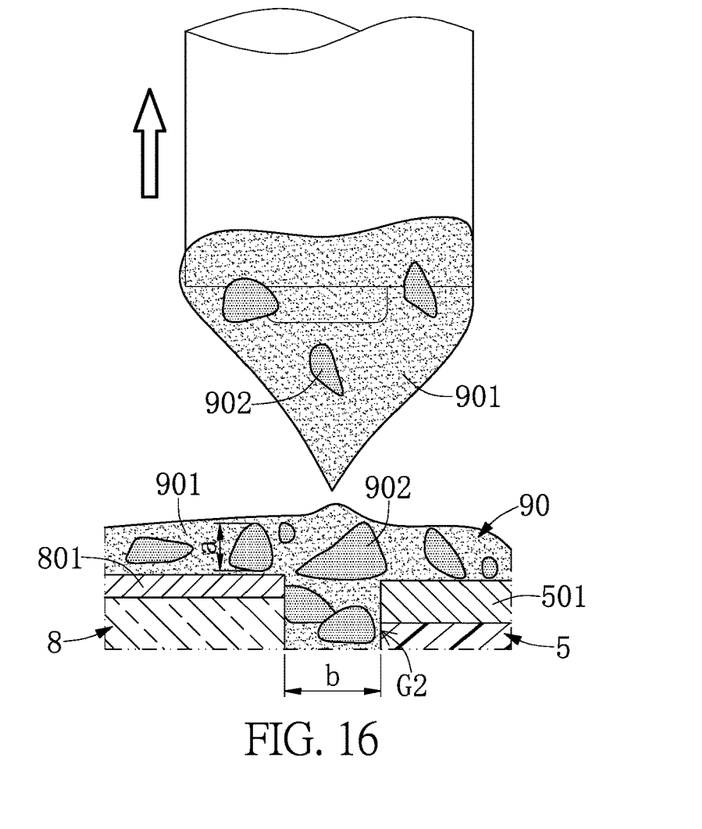

As shown in FIG. 9 to FIG. 11, a light source package structure that is formed by adjusting the light source package structure shown in FIG. 1 to FIG. 3 is provided, and the same part of the basic architecture shown in FIG. 1 to FIG. 3 will not be reiterated herein. The main difference between the light source package structure shown in FIG. 1 to FIG. 3 and the light source package structure shown in FIG. 9 to FIG. 11 is described as follows. The light source package structure 100 includes a substrate 1, an upper electrode layer 2 and a lower electrode layer 3 respectively disposed on opposite sides of the substrate 1, a plurality of conducting pillars 4 embedded inside of the substrate 1, a light emitting unit 6 mounted on the upper electrode layer 2, a surrounding wall 5 disposed on the substrate 1 and arranged to surround the light emitting unit 6, a conductive unit 50 disposed on the surrounding wall 5, a light permeable element 8 disposed on the surrounding wall 5 and covering the light emitting unit 6, two detection circuits 80 formed on the light permeable element 8, and a plurality of conductive adhesives 90 fixing the light permeable element 8 onto the surrounding wall 5. Some of the above components that are similar or identical to the components shown in FIG. 1 to FIG. 3, such as the substrate 1, the surrounding wall 5, the light emitting unit 6, and the light permeable element 8, will not be reiterated herein.

The lower electrode layer 3 is disposed on the second surface 12 of the substrate 1 and includes a first lower electrode layer 31 and a second lower electrode layer 32 both coplanarly disposed. The first lower electrode layer 31 includes two first lower electrode pads 311, and the second lower electrode layer 32 includes two second lower electrode pads 321. The two first lower electrode pads 311 of the first lower electrode layer 31 are electrically connected to the upper electrode layer 2 respectively through the conducting pillars 4. The two second lower electrode pads 321 of the second lower electrode layer 32 are electrically connected to the conductive unit 50. The light emitting unit 6 is mounted on the upper electrode layer 2 (substantially mounted on a central portion thereof) so as to be electrically connected to the first lower electrode layer 31 through the upper electrode layer 2.

The conductive unit 50 is disposed on the surrounding wall 5 and is electrically connected to the second lower electrode layer 32. In the present embodiment, the conductive unit 50 includes a plurality of lower pads 502, a plurality of upper pads 501 that correspond in position to the lower pads 502, a plurality of connecting lines 503 that are configured to connect the upper pads 501 respectively to the lower pads 502, two transmission lines 504 respectively connected to the lower pads 502, and two conductive pillars 505 respectively connected to the two transmission lines 504.

The lower pads 502 and the upper pads 501 are disposed on the surrounding wall 5, and a first height position of the lower pads 502 at the surrounding wall 5 is different from (e.g., lower than) a second height position of the upper pads 501 at the surrounding wall 5. In the present embodiment, the lower pads 502 are disposed on the lower tread surface 53 of the surrounding wall 5. The upper pads 501 are disposed on the at least one of the upper tread surface 51 and the upper riser surface 52.

Specifically, the upper pads 501 are disposed on the upper riser surface 52 (and the upper tread surface 51), and positions of the upper pads 501 are respectively arranged adjacent to positions of the lower pads 502. The connecting lines 503 are embedded inside of the surrounding wall 5, and two ends of each of the connecting lines 503 respectively connect one lower pad 502 and one upper pad 501 being adjacent to the one lower pad 502, so that the lower pads 502 are respectively and electrically connected to the upper pads 501 (by the connecting lines 503).

Furthermore, the two transmission lines 504 are embedded inside of the surrounding wall 5. In the present embodiment, each of the transmission lines 504 are substantially located under the lower tread surface 53, and two ends of the transmission lines 504 are respectively connected to the two lower pads 502 that are spaced apart from each other by the receiving space S. From another perspective, a third height position of each of the transmission lines 504 at the surrounding wall 5 is lower than the first height position of the lower pads 502 at the surrounding wall 5.

Parts of each of the two transmission lines 504 are respectively located above the two second lower electrode pads 321 of the second lower electrode layer 32. The two conductive pillars 505 are embedded inside of the substrate 1 and the surrounding wall 5. One end of each of the two conductive pillars 505 is connected to each of the two transmission lines 504, respectively. The other end of each of the two conductive pillars 505 is connected to each of the two second lower electrode pads 321 of the second lower electrode layer 32. Accordingly, the two transmission lines 504 are respectively and electrically connected to the two second lower electrode pads 321 of the second lower electrode layer 32.

In the present embodiment, it should be noted that the conductive unit 50 is described by the above-mentioned components, but the conductive unit 50 can also be adjusted according to design requirements. For example, in other embodiments not shown in the present disclosure, the lower pads 502 of the conductive unit 50 can be omitted.

The two detection circuits 80 are formed on an outer surface of the light permeable element 8, and height positions of the two detection circuits 80 and the outer surface of the light permeable element 8 substantially correspond in position to the upper tread surface 51 of the surrounding wall 5. Accordingly, the metal contacts 801 of the two detection circuits 80 can be connected to the upper pads 501 through the conductive adhesives 90. Any one of the metal contacts 801 of the detection circuit 80 and the upper pad 501 corresponding thereof can be connected by filling within a gap G2 between the light permeable element 8 and the upper riser surface 52 of the surrounding wall 5 through the conductive adhesives 90 (That is, a plurality of fillers 902 are located between an outer side edge of the light permeable element 8 and the upper riser surface 52, and any one of the conductive adhesives 90 in the present embodiment does not contact the lower tread surface 53), and then the metal contacts 801 are electrically connected with the upper pads 501 through the conductive adhesives 90, but the present disclosure is not limited thereto.

As shown in FIG. 12 to FIG. 16, the metal contacts 801 are respectively and electrically connected to the upper pads 501 through the conductive adhesives 90 of the present embodiment. In each of the conductive adhesives 90 and its corresponding metal contact 801 and upper pad 501, the conductive adhesive 90 includes a colloid 901 and the plurality of fillers 902 mixed with the colloid 901. The gap G2 between the metal contacts 801 and the upper pads 501 are fully or partially filled within the fillers 902. Each of the conductive adhesives 90 is filled within the gap G2 through a part of the fillers 902, so that a top edge of the colloid 901 is not arranged in the gap G2. Preferably, a (D90)<b and a (D10)>b/2. The a (D90) describes an equivalent outer diameter a of the fillers 902 where ninety percent of the distribution has a smaller particle size and ten percent has a larger particle size. The gap has a width defined as b. The equation a (D90)<b means that the equivalent outer diameter a is less than the width b of the gap G2 with distribution size D90. Similarly, the equation a (D10)>b/2 means that the equivalent outer diameter a is greater than half of the width b of the gap G2 with distribution size D10. The equivalent outer diameter of the filler 902 has a width of the size distribution span that satisfies 0.3<(D90−D10)/D50<1.6, and preferably (D90−D10)/D50=1.2. Furthermore, increasing the width of the size distribution indicates that since the fillers may have a varied distribution size, the gap G2 may have a varied distribution by the fillers. Therefore, the particle size distribution of the fillers 902 is required to be a certain width of the size distribution; or if the gap G2 is filled with too concentrated fillers, the fillers 902 cannot enter the small gap G2, and if the gap G2 is filled with too dispersed fillers, a probability that the gap G2 is filled by the fillers 902 would be decreased.

Furthermore, the fillers 902 of the conductive adhesives 90 are made of at least one of a metal, a metal alloy, a glass, a polymer, or the combination thereof. The fillers 902 of the conductive adhesives 90 have at least one of a spherical shape, a sheet shape, a strip shape, an irregular shape or the combination thereof, but the present disclosure is not limited thereto.

The colloid 901 may be a formed by low-temperature curing or photo curing, such as an epoxy-based silver adhesive. The epoxy-based silver adhesive has a mass fraction of silver powder in the epoxy resin within a range of 70% to 90%, and the silver powder has a particle diameter less than 2 μm. The fillers 902 are metal particles, and the mass fraction of the fillers in the 901 is within the range of 10%~30%. For example, when the gap G2 has the width b ranging from 20 μm to 60 μm, tin-silver-copper alloy particles with a melting point of 217° C. may be selected as the material of the fillers. The size distribution of the alloy particles may satisfied with the equations, i.e., D10=13.5 μm, D50=18 μm, D90=34.5 μm, and the width of size distribution is (D90−D10)/D50=1.17. The conductive adhesive 90 is formed by mixing the conductive silver adhesive and tin-silver-copper alloy particles after curing. The mass fraction of the tin-silver-copper alloy particles in the conductive silver adhesive is about 20%, and a curing temperature is a constant temperature at 100° C. for a half hour thereof.

From another perspective, the fillers 902 is preferably spherical metal particles, such as nickel balls, silver balls, tin-silver-copper alloys, gold-tin alloys, or other tin balls. Accordingly, the fillers 902 can be more easily squeezed into the gap G2 by needles so that the colloid 901 in the gap G2 is prevented from depression, and then a conductivity of the conductive adhesive 90 can be increased. Accordingly, the difference in impedance results from a shape variation of the conductive adhesive 90 is reduced.

In addition, in other embodiments not shown in the present embodiment, the detection circuit 80 can be formed on an inner side of the light permeable element 8. The metal contacts 801 of the detection circuit 80 are respectively connected to the lower pads 502 of the conductive unit 50.

In conclusion, in the light source package structure of the present embodiment, the fillers of the conductive adhesive are filled within the gap between the surrounding wall and the light permeable element. Accordingly, the conductive adhesive does not collapse from the gap through the fillers, so that a bridge of the electrically connection can be improved. Furthermore, since the fillers of the conductive adhesive are filled within the gap between the surrounding wall and the light permeable element, the conductive adhesive on the side wall can be prevented from being too thin which may result in rupture or an increase in impedance.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light source package structure, comprising:
a substrate including a first surface and a second surface that is opposite to the first surface;
an upper electrode layer and a lower electrode layer respectively disposed on the first surface of the substrate and the second surface of the substrate, wherein the lower electrode layer includes a first lower electrode layer and a second lower electrode layer;
a light emitting unit mounted on the upper electrode layer and electrically connected to the first lower electrode layer through the upper electrode layer;
a surrounding wall disposed on the first surface and arranged to surround the light emitting unit;
a conductive unit including at least one upper pad, the at least one upper pad disposed on the surrounding wall and arranged away from the substrate, the at least one upper pad being electrically connected to the second lower electrode layer;
a light permeable element disposed on the surrounding wall, wherein an outer edge of the light permeable element and an inside surface of the surrounding wall have a gap there-between;

at least one detection circuit formed on the light permeable element and including at least one metal contact arranged adjacent to the at least one upper pad; and at least one conductive adhesive including a colloid and a plurality of fillers mixed with the colloid, wherein the colloid and the fillers are partially filled within the gap, so that the at least one metal contact is electrically connected to the at least one upper pad through the at least one conductive adhesive, and an electrical connection between the at least one metal contact and the at least one upper pad is enhanced through the fillers of the at least one conductive adhesive.

2. The light source package structure according to claim 1, wherein the at least one metal contact and the at least one upper pad are coplanar with each other.

3. The light source package structure according to claim 2, wherein the equivalent outer diameter of the filler has a distribution width that satisfies $0.3<(D90-D10)/D50<1.6$.

4. The light source package structure according to claim 2, wherein the equivalent outer diameter of the filler has a distribution width that satisfies $(D90-D10)/D50=1.2$.

5. The light source package structure according to claim 1, wherein the gap has a width defined as b, and the fillers have an equivalent outer diameter defined as a, and wherein a (D90)<b and a (D10)>b/2.

6. The light source package structure according to claim 1, wherein the fillers of the at least one conductive adhesive are selected from the groups consisting of a metal, a metal alloy, a glass, and a polymer.

7. The light source package structure according to claim 6, wherein the fillers are a plurality of metal particles, the plurality of metal particles mixed in the colloid have a mass fraction within a range of 10% to 30%.

8. The light source package structure according to claim 1, wherein a shape of the fillers of the at least one conductive adhesive is selected from the groups consisting of a spherical shape, a sheet shape, a strip shape, and an irregular shape.

9. The light source package structure according to claim 1, wherein the colloid is a silver adhesive having a particle diameter less than 2 μm, and the fillers are tin-silver-copper alloy particles.

10. The light source package structure according to claim 1, the surrounding wall being annular with a step structure, the surrounding wall including:

an upper tread surface arranged away from the substrate;
an upper riser surface connected to an inner edge of the upper tread surface;

a lower tread surface disposed at an inner side of the upper riser surface, wherein a distance between the lower tread surface and the first surface is less than a distance between the upper tread surface and the first surface; and a lower riser surface connected to an inner edge of the lower tread surface and arranged away from the upper tread surface, wherein the lower riser surface and the first surface jointly define a receiving space;

wherein the light emitting unit is disposed in the receiving space, and the upper pads are arranged on the upper tread surface, and wherein the light permeable element is disposed on the lower tread surface, and the gap is arranged between the outer edge of the light permeable element and the upper riser surface.

11. The light source package structure according to claim 10, wherein the surrounding wall has at least one notch that is recessed from the lower tread surface and the lower riser surface and that is in spatial communication with the receiving space, and the at least one notch defines an air flow channel that is in spatial communication with the receiving space and an external space.

12. The light source package structure according to claim 10, wherein any one of the conductive adhesives does not contact the lower tread surface.

13. The light source package structure according to claim 1, wherein each of the conductive adhesives is filled within the gap through a part of the fillers, so that a top edge of the colloid is not arranged in the gap.

14. The light source package structure according to claim 1, wherein a conductive unit including a plurality of upper pads and a plurality of transmission lines, the transmission lines are configured to respectively and electrically connect the upper pads to the second lower electrode layer.

15. The light source package structure according to claim 1, wherein the number of the at least one detection circuit is two, the two detection circuits are formed on an outer surface of the light permeable element, and height positions of the two detection circuits and the outer surface of the light permeable element substantially correspond in position to the upper tread surface of the surrounding wall.

16. The light source package structure according to claim 15, wherein the metal contacts of the two detection circuits are connected to the upper pads through the at least one conductive adhesive.

* * * * *